(12) United States Patent
Dowdy et al.

(10) Patent No.: US 6,317,329 B1
(45) Date of Patent: Nov. 13, 2001

(54) DATA STORAGE MODULE ALIGNMENT SYSTEM AND METHOD

(75) Inventors: James L. Dowdy, Eagle, ID (US); Alicia G. Mercer, Roseville; Herbert J. Tanzer, Folsom, both of CA (US); Darrel W. Poulter, Middleton, ID (US); David Dickey, Auburn, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/191,301

(22) Filed: Nov. 13, 1998

(51) Int. Cl.[7] ..................................................... H05K 7/00
(52) U.S. Cl. ......................... 361/725; 361/741; 361/801; 361/802; 439/62; 439/64; 312/223.3; 312/233; 312/332.1
(58) Field of Search ..................................... 361/725–726, 361/727, 683–686, 788, 741, 756, 801, 802; 439/64, 62; 312/223.3, 333, 332.1

(56) References Cited

U.S. PATENT DOCUMENTS 3,733,523 * 5/1973 Reynolds et al. ................. 211/41.17
5,031,075 * 7/1991 Casanova et al. ..................... 361/802
5,353,198 * 10/1994 Kabat et al. .......................... 361/802
5,546,276 * 8/1996 Cutts et al. ........................... 361/724
5,793,614 * 8/1998 Tollbom ............................... 361/732
5,889,850 * 3/1999 Sochacki ............................... 379/329
6,058,016 * 5/2000 Anderson et al. .................... 361/727

* cited by examiner

*Primary Examiner*—Leo P. Picard
*Assistant Examiner*—David Foster

(57) ABSTRACT

A data storage module alignment system and method for use in a data storage module and enclosure system including a module enclosure having a plurality of bay slots and at least one data storage module. The data storage module alignment system comprises at least one alignment guide that is adapted to be mounted at the module enclosure entrance and at least one guide rail that is adapted to be mounted to the data storage module. The alignment guide includes a plurality of guide channels having rounded edges. The guide rail is sized and shaped for receipt within the guide channels. Typically, the alignment guide further includes a plurality of guide flanges that are arranged asymmetrically along the alignment guide. The inner side of each guide flange defines an edge of one of the guide channels and includes chamfers which facilitate initial alignment of the data storage module within one of the bay slots of the module enclosure.

20 Claims, 7 Drawing Sheets

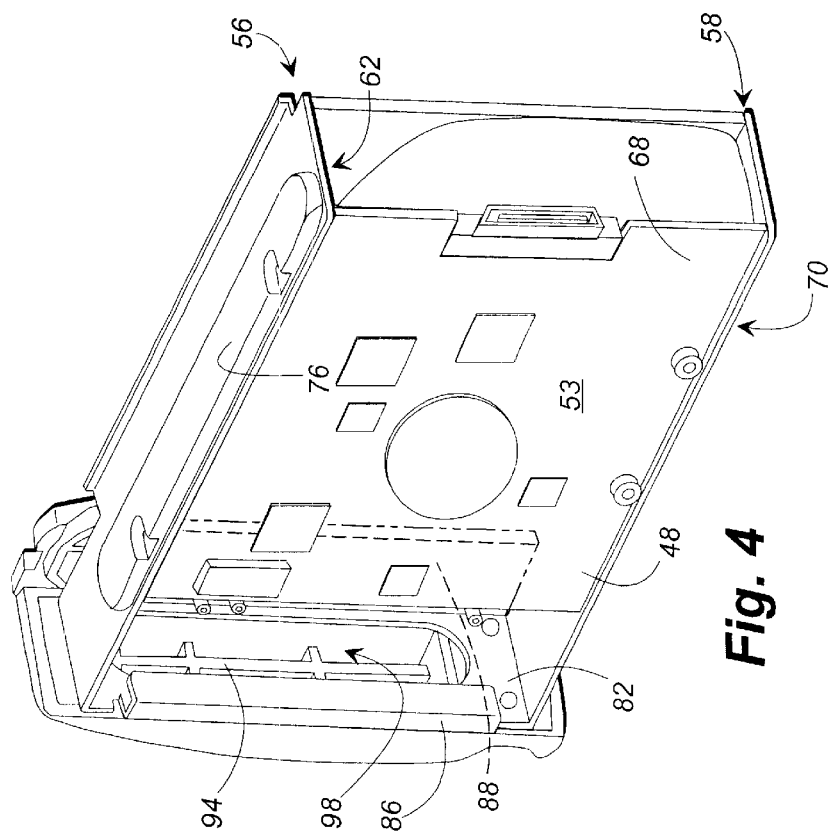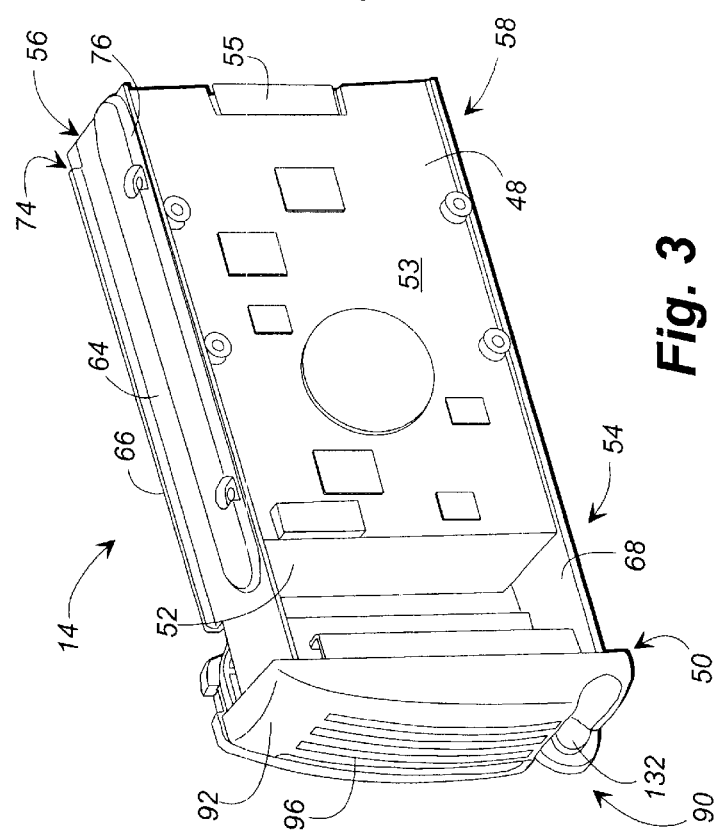

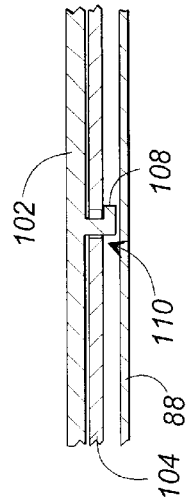
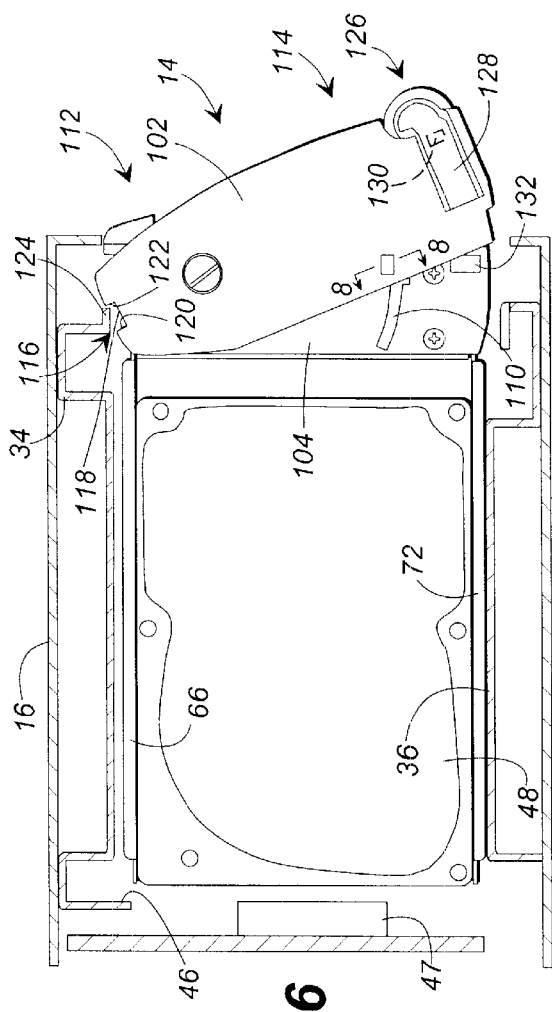
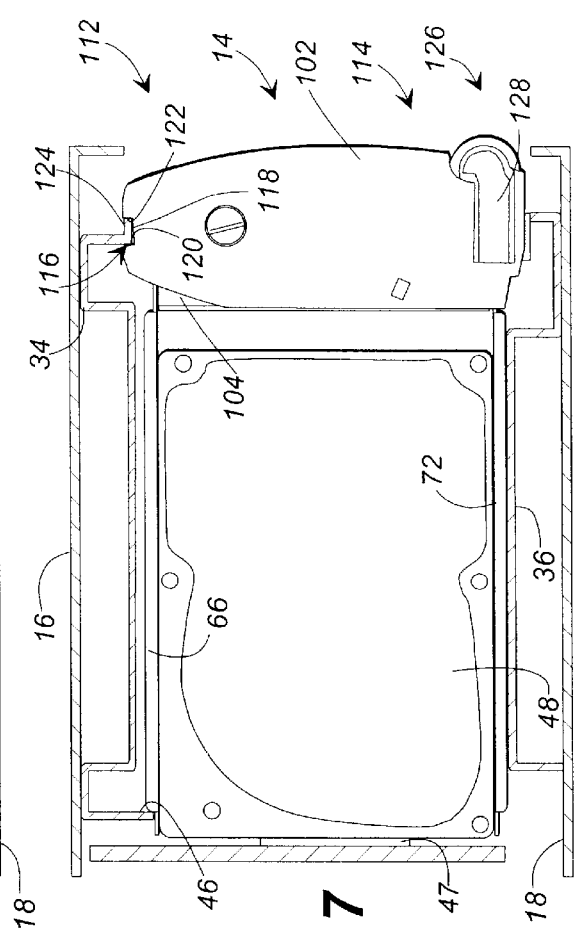

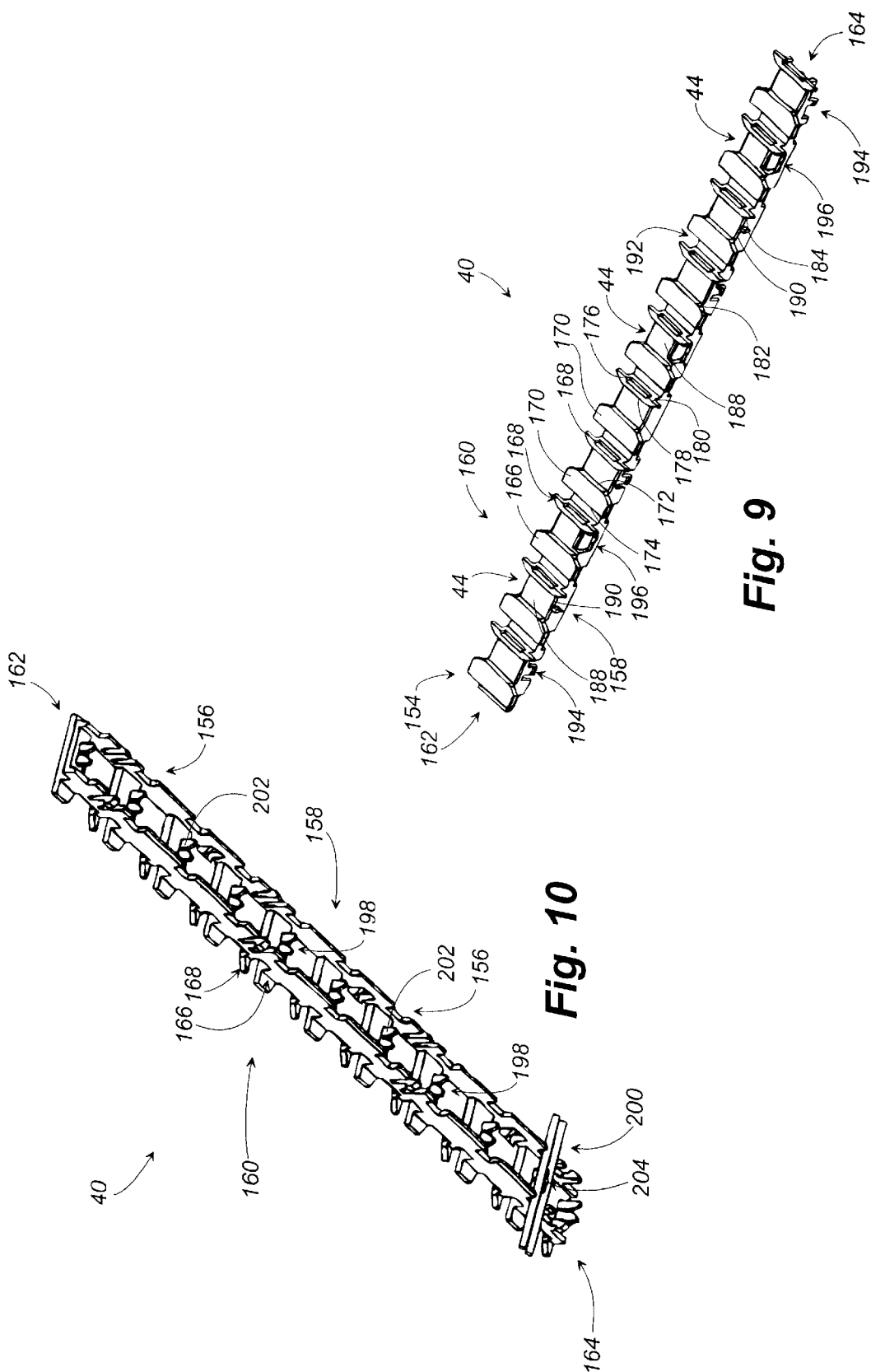

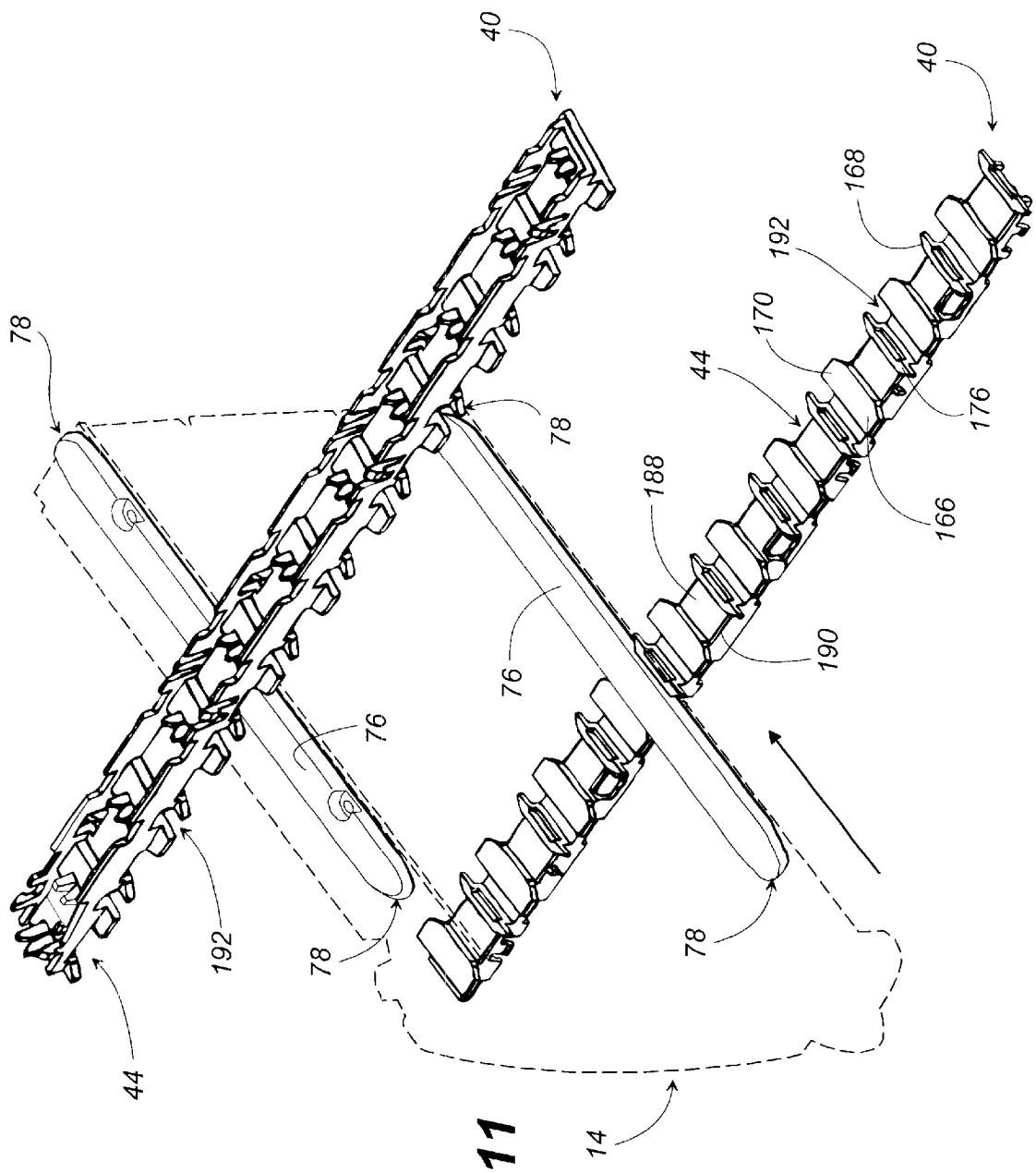

DATA STORAGE MODULE ALIGNMENT SYSTEM AND METHOD

FIELD OF THE INVENTION

The invention relates generally to data storage equipment. More particularly, the invention relates to a data storage module alignment system and method that uses alignment guides that mount within a module enclosure and cooperate with guide rails provided on the data storage modules.

BACKGROUND OF THE INVENTION

Data storage equipment components typically comprise a plurality of data storage modules that slidably dock within a module enclosure formed at the front end of the component. Normally, the data storage modules include disk drives that each include a plurality of internal disks or platters that spin at high speeds within the drive during drive operation.

Typically, the module enclosures include a sheet metal inner chassis that comprises a plurality of unitarily formed inner guide tracks that help guide the data storage module into position in one of several bay slots. In that these guide tracks are positioned relatively deep within the module enclosure, the guide tracks do not aid the user in aligning the data storage module during the initial part of insertion of the module. Because of this fact, the user must normally look within the enclosure to determine exactly where the module fits within the enclosure.

Unless the user exercises a great deal of care when inserting the data storage module, the modules are often bumped against the metal guide tracks until the module is properly aligned within the enclosure. The force imparted by this bumping can shock the module, causing damage to the sensitive data storage device mounted therein. This problem is exacerbated when the user mistakenly attempts to insert the data storage module upside down within the enclosure. Upside down insertion of the modules can easily occur in conventional systems since such systems have no keying features that prevent such insertion. When inserted upside down, the module can become jammed within the enclosure risking severe damage to the data storage device. Even when the module does not become jammed, upside down insertion can damage the multiple pin connectors normally used to electrically connect the data storage device to the equipment component.

From the above, it can be appreciated that it would be desirable to have a data storage module alignment system which avoids the problems identified above.

SUMMARY OF THE INVENTION

Briefly described, the present invention relates to a data storage module alignment system for use in a data storage module and enclosure system including a module enclosure having a plurality of bay slots and at least one data storage module. The data storage module alignment system comprises at least one alignment guide adapted to be mounted, at the module enclosure entrance and at least one guide rail adapted to be mounted to the data storage module. The alignment guide includes a plurality of guide channels formed in the top side of the guide, each guide channel having a channel base. The guide rail is sized and configured for receipt within the guide channels of the alignment guide and includes at least a first tapered end.

Typically, the alignment guide includes a plurality of guide flanges that are arranged asymmetrically along the top side of the alignment guide. The inner side of each guide flange defines an edge of one of the guide channels and includes chamfers which facilitate initial alignment of the data storage module within one of the bay slots of the module enclosure. The bases of the channels normally are substantially planar and include rounded edges which facilitate initial insertion of the data storage module within the module enclosure bay slot. When the data storage module alignment system of the present invention is used, the tapered configuration of the guide rails and the chamfers of the guide channels help prevent shock to the data storage device. Furthermore, upside down insertion of the module is prevented due to the asymmetrical configuration of the guide flanges along the length of the alignment guides.

The particular objects, features, and advantages of this invention will become more apparent upon reading the following specification, when taken in conjunction with the accompanying drawings. It is intended that all such additional features and advantages be included therein with the scope of the present invention, as defined by the claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. In the drawings, like reference numerals designate corresponding parts throughout the several views.

FIG. 3 is an upper front perspective view of a data storage module shown in FIG. 1.

FIG. 4 is an upper rear perspective view of the data storage module shown in FIG. 3.

FIG. 6 is a side view of a data storage module similar to that shown in FIGS. 1–4, inserted within a module enclosure in the unlatched position.

FIG. 7 is a side view of the data storage module and module enclosure shown in FIG. 6, depicting the module in the latched position.

FIG. 8 is cross-sectional view taken along lines 8—8 shown in FIG. 6.

FIG. 9 is an upper perspective view of a data storage module alignment guide shown in FIGS. 1–2.

FIG. 10 is a lower perspective view of the data storage module alignment guide shown in FIG. 3.

FIG. 11 is an upper perspective view depicting cooperation between the alignment guides and guide rails.

DETAILED DESCRIPTION

Figure 1:
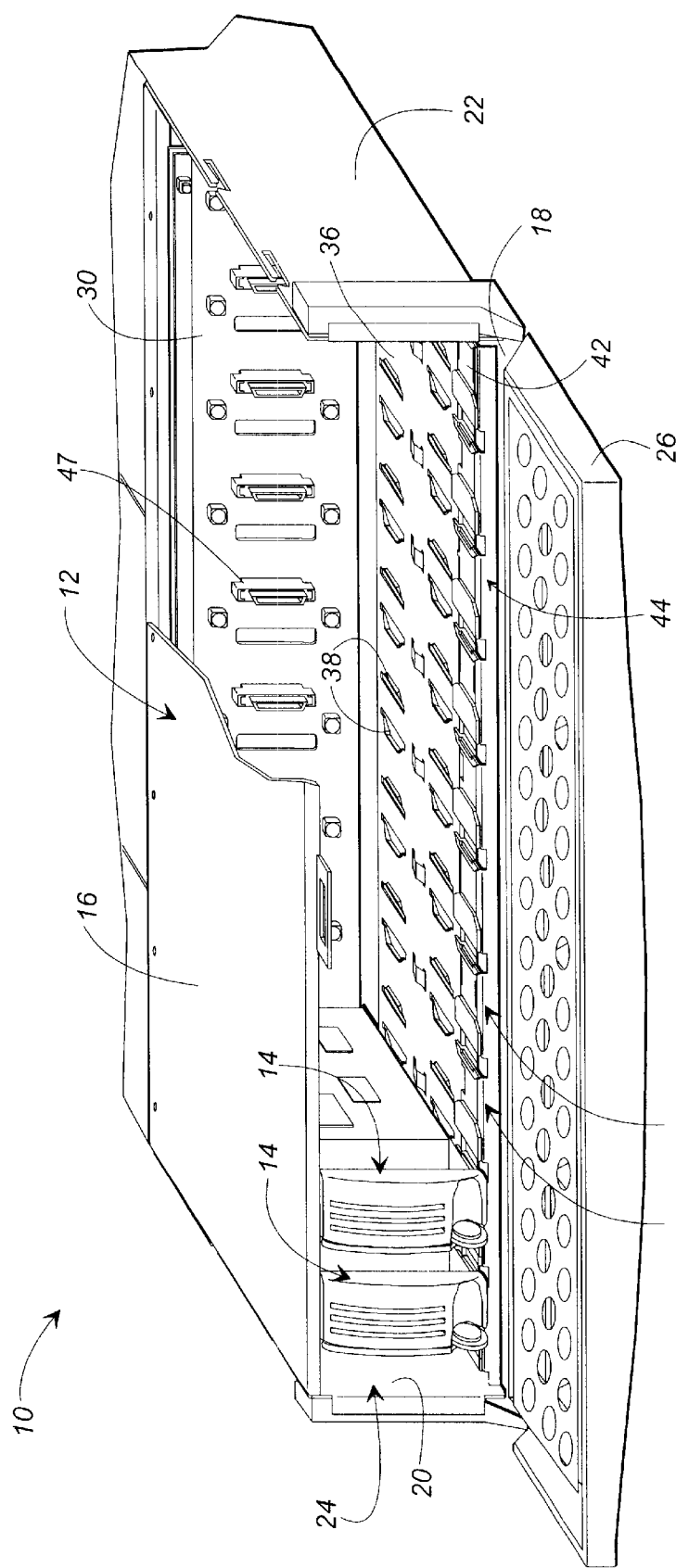
FIG. 1 is an upper right perspective view of a data storage module and enclosure system constructed in which the present invention is utilized.

Referring now in more detail to the drawings, in which like reference numerals indicate corresponding parts throughout the several views, FIG. 1 illustrates a data storage module and enclosure system 10. The system 10 generally comprises a module enclosure 12 that forms part of an equipment component, and a plurality of data storage modules 14 that can be slidably inserted within the module enclosure 12.

Figure 2:
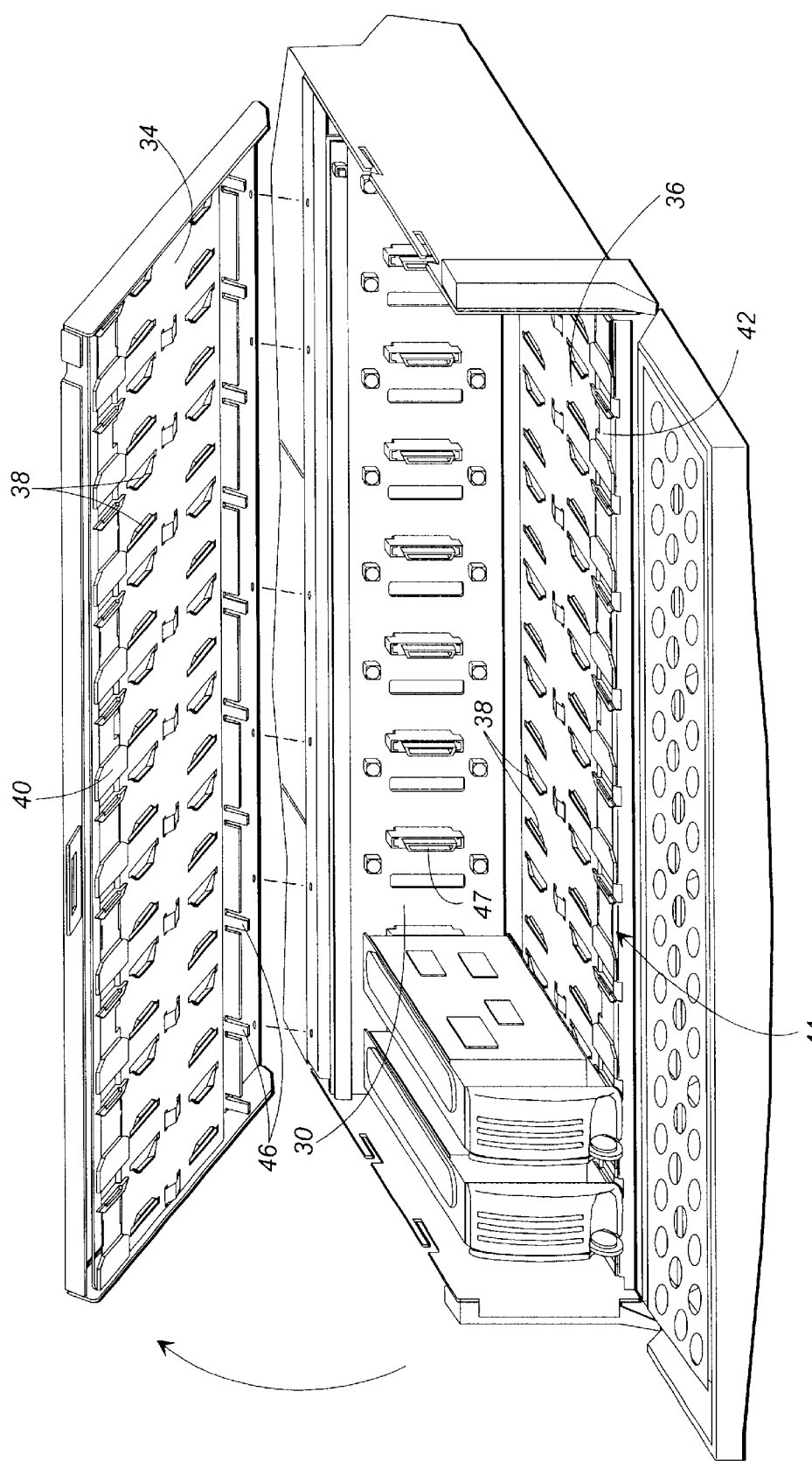
FIG. 2 is an upper right perspective view of the module enclosure shown in FIG. 1, with the upper side of the enclosure shown detached from the enclosure.

As indicated in FIGS. 1 and 2, the module enclosure 12 comprises a substantially rectilinear housing which includes a top side 16, bottom side 18, and a pair of opposed lateral walls 20 and 22. The front of the enclosure 12 forms a frontal opening 24 such that the module enclosure 12 has an open-faced configuration. Typically, an enclosure door 26 is pivotally mounted to the module enclosure 12 at the bottom of the frontal opening 24 to close the module enclosure 12 during normal operation. Inside the module enclosure 12 is a plurality of module bay slots 28 that extend linearly from the front of the enclosure to a main circuit board or backplane 30 of the system positioned at the rear of the enclosure 12. Each of the module bay slots 28 is adapted to receive a data storage module 14. As is apparent from FIG. 1, when the data storage modules 14 are inserted within the enclosure 12, the data storage modules 14 are tightly packed with respect to each other such that the system provides for a very high mass storage density.

Mounted to the top and bottom sides 16 and 18 inside the enclosure 12 are top and bottom guide plates 34 and 36. These guide plates 34, 36 typically are composed of sheet metal and include inner guide tracks 38 that guide the data storage modules 14 along their respective bay slots 28, although it will be appreciated that the guide plates 34, 36 could be constructed of a suitable polymeric material, if desired. Furthermore, although depicted as being constructed as separate parts, the top and bottom guide plates could be formed unitarily with the top and bottom sides, respectively. Adjacent the frontal opening 24 of the enclosure 12 are top and bottom alignment guides 40 and 42, respectively. As is discussed in detail below, each alignment guide 40, 42 is provided with a plurality of channels 44 that guide the data storage modules 14 to the inner guide tracks 38 of the guide plates 34 and 36. As is discussed below, the channels 44 and the inner guide tracks 38 aid the user in aligning the data storage modules 14 in their respective bay slots 28 such that the data storage device within the module can be properly connected to a multiple pin connector 47 mounted to the backplane 30.

As indicated in FIG. 2, the top guide plate 34 mounted to the top side 16 of the module enclosure 12 includes a plurality of compliant tabs 46 which individually abut the data storage modules 14 when the modules are fully inserted within the enclosure. The compliant tabs 46 typically comprise relatively stiff metal springs that are unitarily formed with the top guide plate 34. As is described in more detail below, these tabs protect the multiple pin connectors of the data storage module 14 and the module enclosure 12 and ensure that proper engagement is made therebetween.

Figure 5:
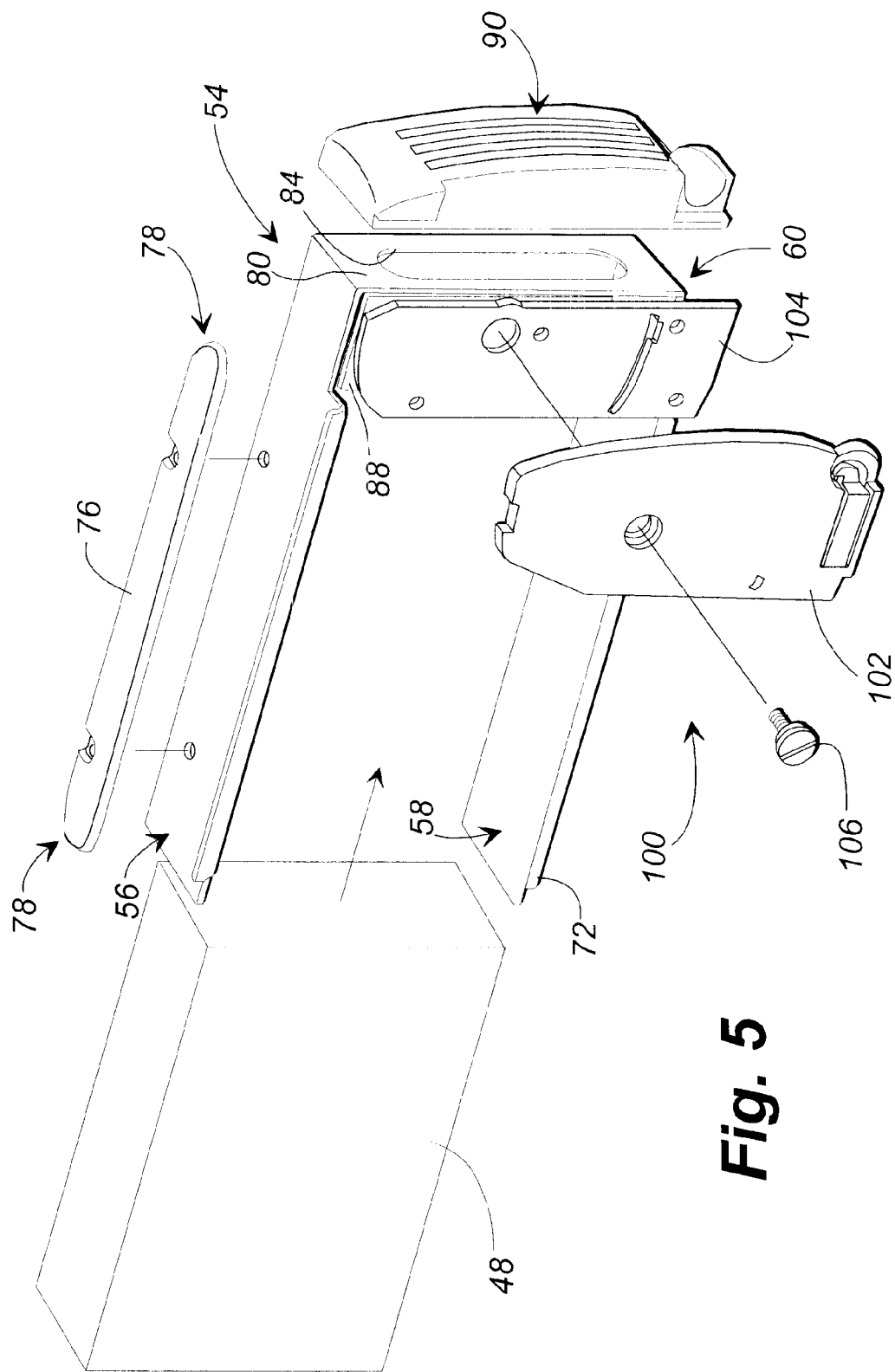
FIG. 5 is an upper front exploded view of the data storage module shown in FIGS. 3–4.

FIGS. 3–5 illustrate the data storage module 14 in detail. As shown in these figures, the data storage module 14 generally comprises a data storage device 48 and a data storage device carrier 50. Typically, the data storage device 48 comprises a disk drive that generally comprises a sealed housing 52 which encloses a head/disk assembly comprising one or more disks or platters which are rotated at constant speed during operation (not shown). Outside of the sealed housing 52 is a circuit board 53 that includes a multiple pin connector 55. As is known in the art, disk drives are high precision instruments that are designed to provide thousands of hours of trouble free operation in mechanically stable environments. However, as discussed above, the high rotational speeds of the platters create gyroscopic forces that can cause excessive rotational vibrations that, if not properly attenuated, can interfere with proper drive operation and can even permanently damage the platters.

The data storage device carrier 50 comprises a data storage device canister 54 that, as shown most clearly in FIG. 5, includes a top side 56, a bottom side 58, and a front side 60. Typically, the canister 54 is unitarily constructed from a single piece of sheet metal which is folded to form the aforementioned sides of the canister. Although unitary construction is preferred, it is to be understood that alternative construction is possible, if desired. As shown in FIGS. 3–4, the data storage device 48 fixedly mounts to the top and bottom sides 56 and 58 of the canister 54 with conventional fasteners such as screws or bolts. Normally, the sides of the canister 54 do not include side walls such that the canister has an open configuration and such that the data storage device 48 mounted thereto is exposed to the ambient air. The absence of such side walls provides for greater packing density of the data storage modules 14 within the module enclosure 12 and further provides for improved heat dissipation by increasing access to cooling air drawn through the system. With the open canister configuration, each data storage module 14 can be spaced from the next by a distance as small as 2 mm.

The top and bottom sides 56 and 58 of the canister 54 typically are substantially planar and rectilinear in shape. The top side 56 includes inner and outer surfaces 62 and 64 and a side flange 66 which extends outwardly from the outer surface 64 of the top side 56. Similarly, the bottom side 58 includes inner and outer surfaces 68 and 70 and a side flange 72 which extends outwardly from the outer surface 70 of the bottom side 58. Each of the top and bottom sides 56 and 58 is provided with an end notch 74 positioned at the rear of the canister 54. As is discussed below, at least the top end notch 74 is adapted to receive one of the compliant tabs 46 of the module enclosure 12. Mounted to the outer surfaces 64 and 70 of the top and bottom sides 56 and 58, respectively, are guide rails 76 which are adapted to be received by the channels 44 of the alignment guides 40, 42 of the module enclosure 12. These guide rails 76 align with the alignment guides 40, 42 as well as the inner guide tracks 38 formed on the top and bottom guide plates 34 and 36 of the module enclosure 12 to facilitate insertion of the data storage modules 14 into the module enclosure 12. As shown in FIGS. 3–5, the guide rails 76 have substantially tapered ends 78 which simplify the insertion process. Typically, the guide rails 76 are constructed of a relatively soft material such as a polymeric material such that the guide rails dampen shocks and slide smoothly along the channels 44 and guide tracks 38 during module insertion.

The front side 60 of the canister 54 is substantially planar and rectilinear in shape and comprises a front surface 80, a rear surface 82, and an elongated finger opening 84. The front side 60 further comprises an angled flange 86 that extends from the lateral edge of the front side. As indicated most clearly in FIGS. 3 and 4, the angled flange 86 extends rearwardly from the front surface 80 of the front side 60 for a distance and then extends inwardly at a generally right angle. Together with the elongated finger opening 84, the angled flange 86 facilitates handling of the data storage module 14. Extending from the other lateral edge of the front side 60 is a latch mechanism mounting flange 88. As shown in FIG. 5, the mounting flange 88 is substantially planar and rectilinear in shape and extends rearwardly from the front side 60 in a plane generally perpendicular to that comprising the front side.

Mounted to the front surface 80 of the front side 60 of the canister 54 is a bezel 90. As depicted in FIGS. 3–5, the bezel 90 has a substantially convex outer surface 92 which is generally contoured to fit the shape of the user's palm, and a substantially planar inner surface 94 which is adapted to engage the front surface 80 of the front side 60 of the canister 54. Normally, the bezel 90 is composed of a durable polymeric material and is heat staked in place on the front side of the canister. The bezel 90 includes a plurality of air inlets 96 that are used to draw air into the module enclosure 12 from the atmosphere for cooling of the data storage devices 48. As illustrated in FIG. 4, the inner surface 94 includes a finger cavity 98 which, together with the elongated finger opening 84 and the angled flange 86, facilitates handling of the data storage module 14.

As shown in FIG. 5, a latch mechanism 100 is mounted to the latch mechanism mounting flange 88. The latch mechanism 100 generally comprises a latch lever 102 and a latch lever retainer 104. Typically, the latch lever 102 and the latch lever retainer 104 are both substantially planar in shape and constructed out of a durable polymeric material. Although planar, each of the latch lever and the latch lever retainer is robust in design in comparison to previous module latch mechanisms to better withstand the loading forces imposed thereon during latching and unlatching of the data storage module 14 as well as forces that could be imposed on the module if it is accidentally dropped. The latch lever retainer 104 mounts directly to the latch mounting flange 88 with a plurality of conventional fasteners, and the latch lever 102 pivotally mounts to the latch lever retainer 104, and the remainder of the disk drive carrier 50, with another conventional fastener 106 such as a shoulder screw. The axis of the shoulder screw forms a pivot point about which the latch lever 102 can angularly pivot. The extent to which the latch lever 104 can pivot is limited by an L-shaped follower 108 that is formed on the latch lever that travels along an arcuate slot 110 formed in the latch lever retainer 104 as indicated in FIGS. 6–8.

The latch lever 102 generally comprises a latch end 112 and a handle end 114 as indicated in FIGS. 6–7. At the latch end 112 is a lock notch 116 that is defined by a notch base 118 and leading and trailing edges 120 and 122. Arranged in this manner, the lock notch 114 is adapted to receive a lock rail 124 of the top guide plate 34 positioned adjacent the frontal opening 24 of the module enclosure 12. At the handle end 114 of the latch lever 102 is a handle 126 which surrounds a flexible cantilever latch member 128. Typically, the cantilever latch member 128 takes the form of an elongated, substantially planar member which is formed unitarily with the latch lever 102. On the inner surface of the latch member 128 is a catch 130 (indicated with hidden lines) that is sized and shaped for receipt by a catch notch 132 formed in the latch lever retainer 104. As shown in FIG. 3, a finger tab 132 is formed at the distal end of the cantilever latch member 128 which provides a surface that the user can press when the data storage module 14 is to be removed from the module enclosure 12. As indicated most clearly in FIG. 1, the handle 126 typically is laterally displaced towards the center of the data storage module 14 relative to the latch mechanism 100 to provide a visual indication to the user as to which handle belongs to which module.

FIGS. 9 and 10 illustrate an alignment guide 40 in detail. Typically, each alignment guide 40 is formed unitarily from a polymeric material that normally contains a dye such that the alignment guide is colored so as to visually stand out from the remainder of the module enclosure 12 when mounted therein. As shown in FIGS. 9 and 10, each alignment guide 40 is substantially elongated and rectilinear in shape and includes a top side 154, a bottom side 156, a front side 158, a rear side 160, and first and second ends 162 and 164. Formed along the top side 154 of the alignment guide is a plurality of relatively wide guide flanges 166 and relatively narrow guide flanges 168. As indicated in the figures, these relatively wide and relatively narrow guide flanges 166 and 168 are arranged alternately along the length of the alignment guide 40 such that the alignment guide is asymmetrical along its length. This asymmetry provides for a keyed configuration that aids the user in properly inserting the modules 14 within the enclosure 12, as is discussed below.

Each relatively wide guide flange 166 comprises a top side 170, an inner side 172, and an outer side 174. Similarly, each relatively narrow guide flange 168 comprises a top side 176, an inner side 178, and an outer side 180. The top sides 170, 176 of the flanges are substantially planar and typically lie within the same plane. The inner sides 172 of the relatively wide guide flanges 166 are provided with chamfers 182. Likewise, the inner sides 178 of the relatively narrow guide flanges 168 are provided with chamfers 184. As is discussed below, these chamfers 182, 184 facilitate initial alignment of the data storage modules 14 during the insertion process. The inner sides 172 and 178 define the edges of guide channels 44 that are adapted to receive the guide rails 76 of a data storage module 14. The guide channels 44 include substantially planar bases 188 that have rounded edges 190 which, as is described below, facilitate initial insertion of the data storage modules 14.

Provided in the top side 154 of the alignment guide 40 between the outer sides 174 and 180 of the relatively wide and relatively narrow flanges 166 and 168 are latch mechanism channels 192. The latch mechanism channels 192 are each adapted to receive the latch mechanism 100 of a data storage module 14 when the module is fully inserted within the module enclosure 12. As is evident from FIGS. 9 and 10, the latch mechanism channels 192 typically are more narrow and deeper than the guide channels 44. Formed along the front and rear sides 158 and 160 of the alignment guide 40 are resilient mounting tabs 194 that are adapted to snap fit within the top and bottom guide plates 134 and 136 to secure the alignment guides 40, 42 therein. The front side 158 of the alignment guide 40 typically is further provided with angled lock tabs 196 that lock the alignment guides within the top and bottom guide plates 34 and 36. As indicated in FIG. 9, the bottom side 156 of the alignment guide 40 is provided with light pipe retainers 198 that are used to retain light pipes 200 of the module enclosure. Typically, the light pipe retainers 196 are formed as forks having tines 202 that are adapted to receive a tie bar 204 formed on the light pipes.

The primary structural features of the invention having been described above, the insertion of the data storage module 14 into the module enclosure 12 will now be discussed. When a data storage module 14 is to be inserted into a bay slot 28 of the module enclosure 12, the latch lever 102 is placed in the unlatched position depicted in FIG. 6. With reference to FIG. 11, the guide rails 76 of the data storage module 14 are aligned with the guide channel 44 of the top and bottom alignment guides 40 and 42 associated with the selected bay slot 28. This alignment with the guide channels 44 is facilitated by the distinct color of the alignment guides 40. When the data storage module 14 is inserted forwardly into the module enclosure 12, contact is made between the first ends 78 of the guide rails 76 and the guide channels 44. Due to the tapered configuration of the ends 78 of the guide rails 76 and the chamfers 182 and 184 of the inner sides 172 and 178 of the guide flanges 166 and 168, alignment of the data storage module 14 is simplified, resulting in less shock to the data storage device 48. Shock to the data storage device 48 is further avoided due to the fact that the guide rails and alignment guides are constructed of polymeric material as opposed to a metal material.

Once the guide rails 76 have been properly aligned with the guide channels 44, the data storage module 14 can be fully inserted into the module enclosure 12 as indicated in FIG. 11. The rounded edges 190 of the guide channel bases 188 simplify this insertion, further preventing shock to the data storage device 48. It is to be noted that upside down insertion of the module 14 is prevented due to the asymmetrical configuration of the guide flanges 166, 168 along the length of the alignment guides 40, 42. During insertion of the data storage module 14, the guide rails 76 slide smoothly along the bases 188 of the guide channels 186 while the bottom and top sides of the module carrier 50 slide across the top sides 170 and 176 of the guide flanges 166 and 168, and eventually engage the inner guide tracks 38 that are provided along the top and bottom guide plates 34 and 36 inside the module enclosure 12.

When the data storage module 14 has nearly been fully inserted into its bay slot 28, contact is made between the trailing edge 122 of the latch lever lock notch 116 and the lock rail 124 of the module enclosure. Continued insertion of the module 14 causes the latch lever 102 to rotate in the clockwise (latching) direction due to the force imparted by the lock rail 124 to the trailing edge of the lock notch 116. At this point, the data storage device multiple pin connector 55 first contacts its mating multiple pin connector 47 mounted to the backplane 30 positioned inside the enclosure 12. Insertion of the data storage module 14 can then be completed by gripping the handle 126 between the thumb and index finger, by example, and pushing it forwardly. This pushing motion further rotates the latch lever 102 in the clockwise direction and brings the leading edge 120 of the notch 118 in contact with the lock rail 124. As the handle 126 is pushed, the forces exerted on the leading edge 120 by the lock rail 124 urges the data storage module 14 forward the remainder of the distance needed to attain complete engagement of the multiple pin connectors 47, 55. As indicated in FIG. 7, latching is completed when the lock rail 124 is in firm contact with the notch base 118 of the latch lever 102 and the cantilever latch member catch 130 is received within the catch notch 132 of the latch lever retainer 104.

Latching in this manner, the data storage module 14 can be quickly and easily electrically connected to the backplane 30 of the module enclosure 12. Although a relatively large force is needed to connect the mating multiple pin connectors 47, 55 of the data storage device 48 and the backplane 30, the latch lever 102 provides a relatively large amount of leverage such that the user need only use finger pressure to complete the insertion of the module 14 and attain full engagement between the connectors. Once latched, the data storage module 14 is held tightly in place. In particular, the firm contact maintained between the lock notch 114 and the lock rail 124 transmits a relatively large amount of force along the latch lever 102 to the shoulder screw, and thereby to the remainder of the module 14. Due to this force, the data storage module 14 may be said to be hard mounted within the module enclosure 12. This hard mounting greatly attenuates the rotational vibrations created by the spinning platters and eliminates contact between the individual platters.

In addition to reducing the force needed to engage the multiple pin connectors 47, 55, the present system further ensures that the proper degree of engagement is had between the multiple pin connectors so that complete contact is made without damaging the connectors. In particular, the compliant tabs 46 of the module enclosure 12 make contact with the end notches 74 of the canisters 54 as shown in FIG. 7 to act as a resilient stop which both relieves some of the force that would normally be transmitted to the connectors and limits insertion of the data storage module to ensure that over engagement of the connectors does not occur. Although described herein as being formed with the top guide plate 34, it will be appreciated that the compliant tabs 46 could be placed in any position within the module enclosure 12 in which the tabs would abut the data storage modules 14 when fully inserted within the enclosure.

To remove the data storage module 14 from the module enclosure 12, the latch lever 102 must first be released. To release the lever 102, the user again grips the handle 126 between the thumb and index finger, by example, and simultaneously presses the finger tab 132 inwardly (left in the embodiment shown in the figures) to release the catch 130 from the catch notch 132. At this point, the latch lever 102 can be rotated in the counter-clockwise (unlatching) direction by pulling the handle 126 outwardly. The counter clockwise rotation of the latch lever 102 forces the trailing edge 122 of the lock notch 118 against the lock rail 124 of the module enclosure to slide the data storage module 14 outwardly from its bay slot 28 and disengage the multiple pin connectors 47, 55 within the enclosure.

Once the connectors 47, 55 have been fully disengaged, the entire data storage module 14 can be removed from the module enclosure 12 by gripping the module and pulling it outwardly from its bay slot 28. The user can securely grip the module by wrapping his/her fingers around the bezel 90 and the angled flange 86 of the canister 54 such that his/her fingers extend through the finger opening 84 of the canister 54 and his/her fingertips are positioned within the finger cavity 98 formed in the bezel 90. When gripped in this manner, the outer surface 92 of the bezel 90 fits within the user's palm such that the module 14 can be held comfortably in the user's hand. Accordingly, the bezel 90 and canister 54 can be said to together form an intuitive grab handle with which the data storage module 14 can be manipulated. Once completely withdrawn from the module enclosure 12, the module 14 can be carried by the grab handle in manner described above.

The grab handle of the present invention presents advantages not realized in conventional systems. First, the grab handle permits the user to obtain a firm control over the module 14. This is particularly important when the data storage is a latest generation disk drive in that the platters within the drive may still spin for 20 to 40 seconds after the data storage module 14 has been withdrawn and therefore is creating gyroscopic forces which could cause the user to lose his/her grip of the module. Second, the grab handle provides the user with way to carry the module 14 without having to touch the data storage 48 itself. This feature is important since the device 48 may be hot when first removed from the enclosure 12 or may have stored electrostatic charges, either of which could cause the user to drop the module 14.

While preferred embodiments of the invention have been disclosed in detail in the foregoing description and drawings, it will be understood by those skilled in the art that variations and modifications thereof can be made without departing from the spirit and scope of the invention as set forth in the following claims.

Therefore, the following is claimed:

1. A data storage module alignment system for use in a data storage module and enclosure system including a module enclosure having a plurality of bay slots and at least one data storage module, said data storage module alignment system comprising:

at least one alignment guide adapted to be mounted at the module enclosure entrance, said at least one alignment guide including a top side, a bottom side, a front side, and a rear side, said at least one alignment guide further including a plurality of guide channels formed in said top side, each guide channel having a channel base; and at least one guide rail adapted to be mounted to the data storage module, said at least one guide rail including first and second ends and being sized and configured for receipt within one of said guide channels of said at least one alignment guide;

wherein said at least one alignment guide and said at least one guide rail are used cooperatively to facilitate proper alignment and insertion of the data storage module within one of the bay slots of the module enclosure.

2. The system of claim 1, wherein said at least one alignment guide further includes a plurality of guide flanges arranged asymmetrically along said top side of said alignment guide, each guide flange having inner and outer sides, said inner side of each guide flange defining an edge of one of said guide channels.

3. The system of claim 2, wherein said inner sides of said guide flanges include chamfers which facilitate initial alignment of the data storage module within the module enclosure bay slot.

4. The system of claim 1, wherein said channel bases are substantially planar and include rounded edges which facilitate initial insertion of the data storage module within the module enclosure bay slot.

5. The system of claim 1, wherein said first end of said at least one guide rail is tapered to facilitate initial alignment and insertion of the data storage module within the module enclosure bay slot.

6. The system of claim 1, wherein said at least one alignment guide is constructed of a polymeric material.

7. The system of claim 1, wherein said at least one guide rail is constructed of a polymeric material.

8. A data storage module alignment guide for use in a data storage module and enclosure system including a module enclosure having a plurality of bay slots and at least one data storage module, said data storage module alignment guide comprising:

top, bottom, front, and rear sides; and a plurality of guide channels formed in said top side, said guide channels being adapted to receive guide rails of the data storage module, each guide channel having a channel base;

wherein said alignment guide is adapted to be mounted at one of the top and bottom sides of the module enclosure entrance and facilitates alignment and insertion of the data storage module within the module enclosure.

9. The alignment guide of claim 8, further comprising a plurality of guide flanges arranged asymmetrically along said top side of said alignment guide, said guide flanges each having inner and outer sides, said inner side of each guide flange defining an edge of one of said guide channels.

10. The alignment guide of claim 9, wherein said inner sides of said guide flanges include chamfers which facilitate initial alignment of the data storage module within one of the bay slots of the module enclosure.

11. The alignment guide of claim 9, wherein said guide flanges each include a substantially planar top side which is adapted to support the data storage module.

12. The alignment guide of claim 9, further comprising a plurality of latch mechanism channels formed on said top side of said alignment guide, the edges of said latch mechanism channels being defined by said outer sides of said guide flanges.

13. The alignment guide of claim 8, wherein said channel bases are substantially planar and include rounded edges which facilitate initial insertion of the data storage module within the module enclosure bay slot.

14. The alignment guide of claim 8, further comprising a plurality of light pipe retainers formed on said bottom side of said alignment guide.

15. The alignment guide of claim 8, further including a plurality of mounting tabs formed on said front and rear sides of said alignment guide.

16. The alignment guide of claim 8, wherein said alignment guide is constructed of a polymeric material.

17. The alignment guide of claim 16, wherein said polymeric material includes a dye such that said alignment guide is distinctly colored with respect to the structure of the module enclosure.

18. A method of aligning data storage modules within bay slots of a module enclosure, said method comprising the steps of:

providing top and bottom alignment guides at the top and bottom of the module enclosure entrance, each alignment guide including a plurality of guide channels formed therein, the guide channels having chamfered ends;

providing top and bottom guide rails on the data storage module, each guide rail being sized and configured for receipt within the guide channels;

aligning the top and bottom guide rails with the guide channels of the top and bottom alignment guides aligned with the selected bay slot; and inserting the data storage module forwardly into the module enclosure with the guide rails sliding smoothly along the guide channels.

19. The method of claim 18, wherein the guide channels each include substantially planar bases having rounded edges, the guide rails sliding along the planar bases of the guide channels during insertion.

20. The method of claim 18, wherein the alignment guides and the guide rails are constructed of a polymeric material.

* * * * *